United States Patent
Gu et al.

(10) Patent No.: US 9,812,060 B2
(45) Date of Patent: Nov. 7, 2017

(54) DISPLAY DEVICE

(71) Applicant: Samsung Display Co., Ltd., Yongin-si, Gyeonggi-do (KR)

(72) Inventors: Bon-Seog Gu, Yongin-si (KR); Jin-Wook Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/402,089

(22) Filed: Jan. 9, 2017

(65) Prior Publication Data

US 2017/0116913 A1 Apr. 27, 2017

Related U.S. Application Data

(62) Division of application No. 13/921,936, filed on Jun. 19, 2013, now Pat. No. 9,542,881.

(30) Foreign Application Priority Data

Mar. 12, 2013 (KR) .................. 10-2013-0026249

(51) Int. Cl.
*H01L 51/52* (2006.01)
*H01L 27/32* (2006.01)
*G09G 3/3208* (2016.01)

(52) U.S. Cl.
CPC ....... *G09G 3/3208* (2013.01); *H01L 27/3241* (2013.01); *H01L 51/524* (2013.01); *G09G 2300/0426* (2013.01)

(58) Field of Classification Search
None
See application file for complete search history.

(56) References Cited

U.S. PATENT DOCUMENTS

| | | | |
|---|---|---|---|
| 5,592,199 A * | 1/1997 | Kawaguchi ......... | G02F 1/13452 257/E23.065 |
| 7,053,548 B2 * | 5/2006 | Nakanishi ........... | H01L 27/3276 257/72 |
| 8,913,052 B2 * | 12/2014 | Gu .......................... | G09G 5/00 345/211 |
| 2002/0180686 A1 * | 12/2002 | Yuda .................... | G02F 1/13452 345/103 |
| 2006/0244893 A1 * | 11/2006 | Oda ..................... | G02F 1/13452 349/151 |
| 2009/0015418 A1 * | 1/2009 | Koike ................... | G06F 21/554 340/636.1 |

(Continued)

FOREIGN PATENT DOCUMENTS

| KR | 10-2004-0044237 | 5/2004 |
| KR | 10-2007-0003016 | 1/2007 |
| KR | 10-2012-0084537 | 7/2012 |

*Primary Examiner* — Patrick Edouard
*Assistant Examiner* — Peijie Shen
(74) *Attorney, Agent, or Firm* — Lewis Roca Rothgerber Christie LLP (57) ABSTRACT

A display device includes: a display panel including: a display portion for displaying an image; and a first pad coupled with the display portion and for receiving an out signal from the display portion; a driver coupled with the display portion for supplying a driving signal to the display portion; a cover covering the display panel; and a connection unit coupling the first pad and the driver to each other to transmit the out signal to the driver, wherein at least a portion of the connection unit is in the cover.

5 Claims, 5 Drawing Sheets

(56) References Cited

U.S. PATENT DOCUMENTS

| | | | |
|---|---|---|---|
| 2009/0050890 A1* | 2/2009 | Hirakata | G02F 1/13392 257/59 |
| 2010/0090995 A1* | 4/2010 | Chung | G02F 1/13336 345/205 |
| 2013/0249863 A1* | 9/2013 | Misaki | G06F 3/044 345/174 |

* cited by examiner

DISPLAY DEVICE

CROSS-REFERENCE TO RELATED APPLICATION

This application is a divisional of U.S. patent application Ser. No. 13/921,936, filed Jun. 19, 2013, which claims priority to and the benefit of Korean Patent Application No. 10-2013-0026249, filed Mar. 12, 2013, the entire content of both of which is incorporated herein by reference.

BACKGROUND

1. Field

The described technology relates generally to a display device. More particularly, the described technology relates generally to a display device including a display panel and a cover that covers the display panel.

2. Description of the Related Art

A display device refers to a device for displaying an image. An organic light emitting diode (OLED) display device is currently in the spotlight.

In general, a display device includes a display panel for displaying an image and a cover covering the display panel.

The above-described general display device may be driven and may be manufactured by various techniques according to the type of the display panel. However, it may be difficult to analyze the technique a manufacturer applied to a display panel of a display device without separation of a cover from the display panel. Accordingly, a cover may be removed from a display panel to analyze the display device.

However, a manufacture may not want its display device to be analyzed.

The above information disclosed in this Background section is only for enhancement of understanding of the background of the described technology, and therefore, it may contain information that does not form the prior art that is already known in this country to a person of ordinary skill in the art.

SUMMARY

Exemplary embodiments provide a display device capable of suppressing a display panel's exposure to discovery of the techniques of manufacturing or of driving.

One aspect of the present invention provides a display device including: a display panel including: a display portion for displaying an image; and a first pad coupled with the display portion and for receiving an out signal from the display portion; a driver coupled with the display portion for supplying a driving signal to the display portion; a cover covering the display panel; and a connection unit coupling the first pad and the driver to each other to transmit the out signal to the driver. Here, at least a portion of the connection unit is in the cover.

The display device may further include a driving board including a second pad coupled with the driver. Here, the driver may be on the driving board, and the connection unit may include: a first internal line in the cover; a first connection portion, coupled to the first internal line, protruding to an outside of the cover, and contacting the first pad; and a second connection portion coupled to the internal line, protruding to the outside of the cover, and contacting the second pad.

The first pad may be at a front side of the display panel, the display panel may further include a third pad coupled to the first pad and at a bottom side of the display panel, the cover may include: a first sub-cover facing a front side of the display panel, the driver being in the first sub-cover; and a second sub-cover facing a bottom side of the display panel and separated from the first sub-cover, the display panel being interposed between the first sub-cover and the second sub-cover, and the connection unit may include: a second internal line in the second sub-cover; a third connection portion coupled to the second internal line, protruding to an outside of the second sub-cover, and contacting the third pad; a fourth connection portion coupled to the second internal line and protruding to the outside of the second sub-cover; a fifth connection portion coupled to the driver, protruding to an outside of the first sub-cover, and contacting the fourth connection portion; and a sixth connection portion coupled to the driver, protruding to the outside of the first sub-cover, and contacting the first pad.

The driver may be configured to not transmit the driving signal to the display portion when the out signal is not received by the driver through the connection unit.

The driver may be configured to delete data stored in the driver when the out signal is not received by the driver through the connection unit.

The display portion may include an organic light emitting element.

The connection unit may be configured to disconnect from the first pad when the cover is separated from the display portion.

According to an aspect of one or more embodiments, a display device capable of limiting the exposure of techniques (e.g., driving techniques or manufacturing techniques) of a manufacturer of a display panel is provided.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in several exemplary embodiments, a constituent element having the same configuration will be representatively described in a first exemplary embodiment by using the same reference numeral, and other configurations different from those of the first exemplary embodiment will be described in other exemplary embodiments.

As the size and thickness of the respective structural components shown in the drawings may be arbitrarily illustrated for explanatory convenience, the present invention is not necessarily limited to what is illustrated. For example, the thickness of layers, films, panels, regions, etc., may be exaggerated for clarity.

In addition, unless explicitly described to the contrary, the word "comprise" and variations such as "comprises" or "comprising," will be understood to imply the inclusion of stated elements but not the exclusion of any other elements. Furthermore, a term "over" or "on" means that a specific part is placed over or on a target part, but does not necessarily mean that the specific part is placed over the target part on the basis of the gravity direction.

Hereinafter, a display device according to a first exemplary embodiment will be described with reference to FIG. 1 to FIG. 3.

Figure 1:
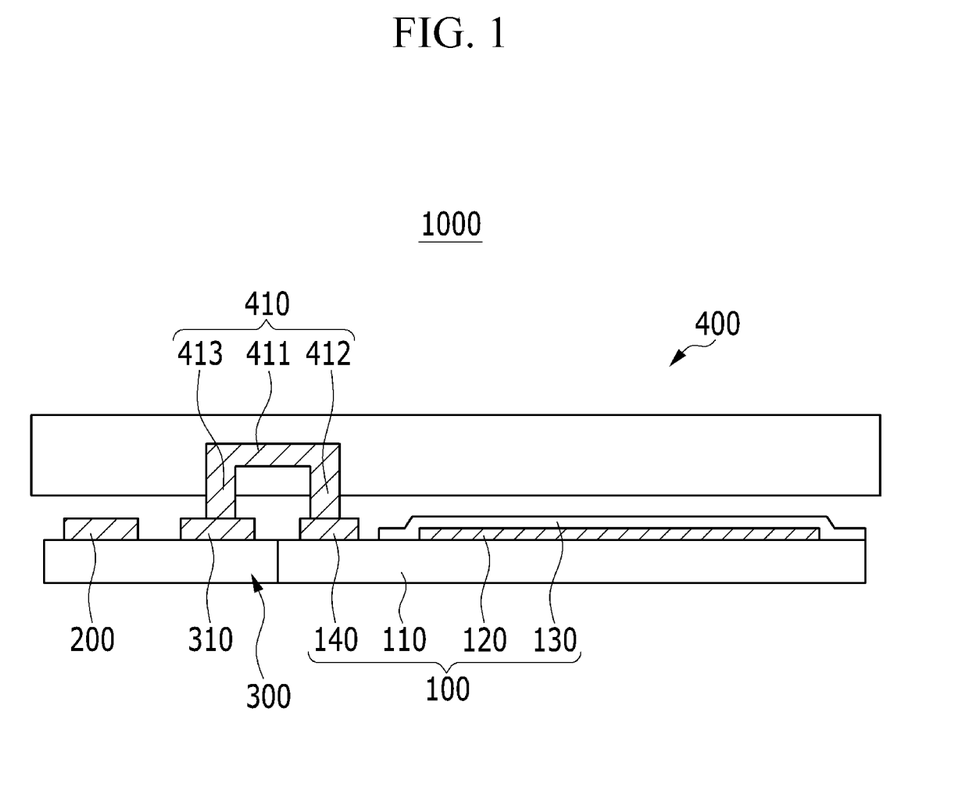
FIG. 1 is a cross-sectional view of a display device according to a first exemplary embodiment.

FIG. 1 is a cross-sectional view of a display device according to the first exemplary embodiment. FIG. 2 is a top plan view of a display panel, a driver, and a driving board of the display device of FIG. 1.

Figure 2:
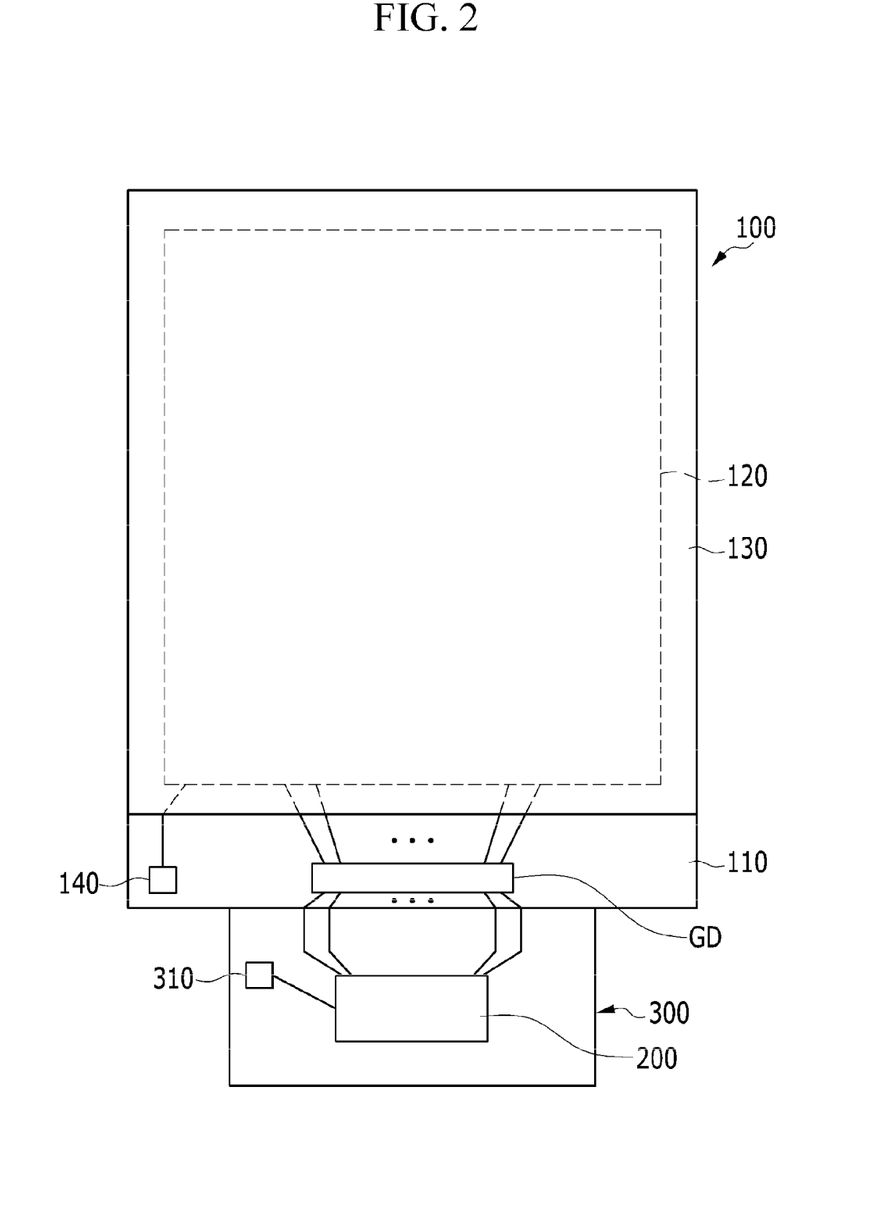
FIG. 2 is a top plan view of a display panel, a driver, and a driving board of the display device of FIG. 1.

As shown in FIG. 1 and FIG. 2, a display device 1000 according to the first exemplary embodiment includes a display panel 100, a driver 200, a driving board 300, and a cover 400.

The display panel 100 displays an image, and includes a substrate 110, a display portion 120 that includes an organic light emitting element, an encapsulation portion 130, and a first pad 140.

The substrate 110 may include glass, a resin, or a metal, and may be made of a light transmission material, a light reflective material, a light absorbing material, or a light semi-transmissive material. The display portion 120 (including the organic light emitting element) is on the substrate 110, and the substrate 110, together with the encapsulation portion 130, seals the display portion 120, where the display portion 120 is between the substrate 110 and the encapsulation portion 130. The substrate 110 and the encapsulation portion 130 (e.g., a thin-film encapsulation portion) protect the display portion 120 from external interference. The substrate 110 may be flexible, and when the substrate 110 is flexible, and at when the encapsulation portion 130 is formed as a thin film, the display panel 100 may be flexible.

The display portion 120 is on the substrate 110 and includes an organic light emitting element that emits light such that an image is displayed using the organic light emitting element. The organic light emitting element of the display portion 120 may include a first electrode, an organic emission layer on the first electrode, and a second electrode on the organic emission layer. The display portion 120 may further include a driving circuit between the organic light emitting element and the substrate 110, and the organic light emitting element may be driven by the driving circuit. The driving circuit of the display portion 120 may include two or more thin film transistors and at least one capacitor. The display portion 120 may receive a driving signal from the driver 200 through a driving driver GD, and the display portion 120 may display an image according to the driving signal transmitted from the driver 200. Here, the driving driver GD may be, for example, an integrated circuit (IC) chip, or may be an assembly of a plurality of thin film transistors formed through a process that forms the display portion 120.

The encapsulation portion 130 seals the display portion 120 together with the substrate 110, and may be formed of one or more thin films. A touch sensor may be formed on or attached to the encapsulation portion 130.

The display portion 120 may apply an out signal to the first pad 140. Here, the out signal may be a signal related to the driving signal used in the display portion 120 to display an image, and data related to the out signal may be stored in the driver 200.

The first pad 140 may be in a non-display area of the substrate 110, which neighbors the display portion 120, and may be connected to the display portion 120. The first pad 140 receives the out signal from the display portion 120. The first pad 140 may be formed through the same process that is performed to form the display portion 120.

In the display panel 100 according to the first exemplary embodiment, the display portion 120 includes the organic light emitting element; however, a display portion according to another embodiment may include a different means for displaying an image. For example, the display portion may include a liquid crystal, an electron ink, or a plasma as the display means. When the display portion 120 includes a liquid crystal, an electron ink, or a plasma as the display means, various known structures may be included in the display panel depending on the type of the display means.

The driver 200 is mounted to the driving board 300 connected with the display panel 100, and may be formed as an IC chip. The driver 200 neighbors the display panel 100 and is connected with the display portion 120 through the driving board 300 to supply a driving signal to the driver 200 for driving of the display portion 120. The driver 200 is connected with the second pad 310 included in (or on or at) the driving board 300. The driver 200 may receive the out signal of the display portion 120 from the second pad 310, and when the out signal of the display portion 120 is not supplied to the driver 200, the driver 200 may not supply the driving signal to the display portion 120 or may delete data stored in the driver 200.

The driving board 300 may be a printed circuit board (PCB) to which the driver 200 is mounted, and may neighbor (e.g., be adjacent to) the display panel 100. The driving board 300 may be connected with the display panel 100 by using, for example, a flexible printed circuit board (FPCB). The driving board 300 includes the second pad 310 connected with the driver 200.

According to an embodiment, the second pad 310 is connected with the first pad 140 of the display panel 100 through a connection unit 410 of the cover 400.

The cover 400 is on the display panel 100, and covers the display panel 100, the driver 200, and the driving board 300 to protect them from external interference. The cover 400 may include glass, a resin, or a metal, and may be made of a light transmission material, a light reflective material, a light absorbing material, or a light semi-transmissive material. The cover 400 includes a connection unit 410.

The connection unit 410 contacts the first pad 140 to couple (e.g., connect) the first pad 140 and the driver 200, thereby transmitting the out signal applied to the first pad 140 from the display portion 120 to the driver 200. The connection unit 410 is formed of a conductive material, such as a metal, and includes a first internal line 411, a first bump 412 (or first connection portion), and a second bump 413 (or second connection portion).

The first internal line 411 is in the cover 400, and extends in the cover 400 to respectively correspond to the first pad 140 and the second pad 310.

The first bump 412 extends in a direction of the first pad 140 from one end of the first internal line 411. The first bump 412 protrudes to the outside of the cover 400 from the inside of the cover 400. The first bump 412 protrudes to the outside of the cover 400, and thus, contacts the first pad 140.

The second bump 413 extends in a direction of the second pad 310 from the other end of the first internal line 411. The second bump 413 protrudes to the outside of the cover 400 from the inside of the cover 400. The second bump 413 protrudes to the outside of the cover 400, and thus, contacts the second pad 310.

The first internal line 411, the first bump 412, and the second bump 413 may be integrally formed. Because the first bump 412 and the second bump 413 respectively contact the first pad 140 and the second pad 310, the out signal applied to the first pad 140 from the display portion 120 is applied to the second pad 310 through the first bump 412, the first internal line 411, and the second bump 413. The out signal applied to the second pad 310 from the display portion 120 is transmitted to the driver 200 connected with the second pad 310.

Hereinafter, an effect of the display device according to the first exemplary embodiment will be described with reference to FIG. 3.

Figure 3:
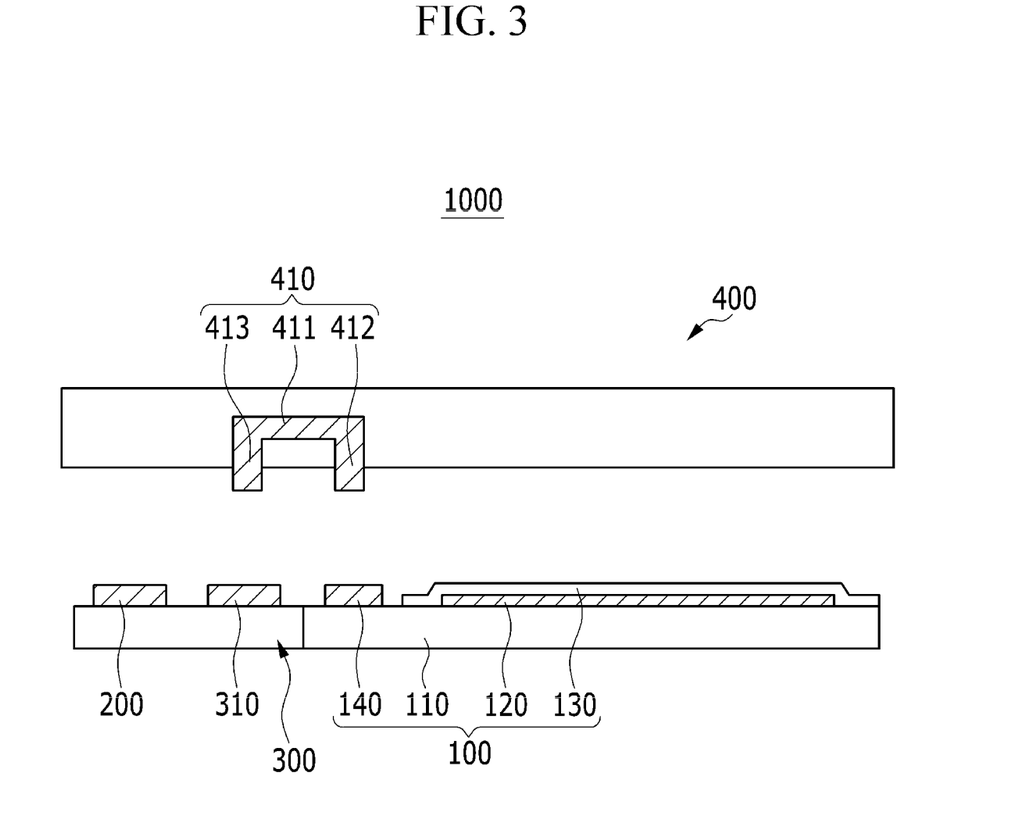
FIG. 3 is a cross-sectional view provided for description of an effect of the display device according to the first exemplary embodiment.

FIG. 3 is a cross-sectional view provided for description of an effect of the display device according to the first exemplary embodiment.

As shown in FIG. 3, when the cover 400 is separated from the display panel 100 and the driver 200, the first bump 412 and the second bump 413 of the connection unit 410 are respectively separated from the first pad 140 and the second pad 310 so that the out signal applied to the first pad 140 from the display portion 120 is not applied to the second pad 310, and accordingly, the out signal is not transmitted to the driver 200 from the display portion 120. That is, when the cover 400 is separated from the display panel 100, the out signal from the display portion 120 cannot be transmitted to the driver 200 through the connection unit 410.

According to an embodiment, when the out signal is not transmitted to the driver 200 from the display portion 120, the driver 200 does not supply a driving signal for driving the display panel 100 to the display portion 120. Accordingly, although power may be supplied to the display panel 100, the display panel 100 is not driven because the driving signal is not supplied to the display panel 100, so that if the cover 400 is separated from the display panel 100 for analysis of the display panel 100, various techniques for driving the display panel 100 (e.g., various techniques of the manufacturer of the display panel) cannot be analyzed.

According to an embodiment, when the out signal is not transmitted to the driver 200 from the display portion 120, the driver 200 deletes the data stored in the driver 200. Accordingly, when the cover 400 is separated, although power may be supplied to the driver 200, no data is in the driver 200, and therefore, the data stored in the driver 200 cannot be analyzed when the cover 400 is separated from the display panel 100.

That is, technical exposure may be suppressed for the manufacturer of the display panel 100 of the display device 1000.

According to an embodiment of the display device 1000, the out signal is not transmitted to the driver 200 from the display portion 120 through the connection unit 410 when the cover 400 is separated from the display panel 100, and thus, when the driver stores data indicating a state that the out signal is not transmitted to the driver 200, whether or not the cover 400 is separated from the display panel 100 may be determined through the driver 200.

That is, whether or not the display device 1000 has been disassembled may be determined.

Hereinafter, referring to FIG. 4 and FIG. 5, a display device according to a second exemplary embodiment will be described.

Figure 4:
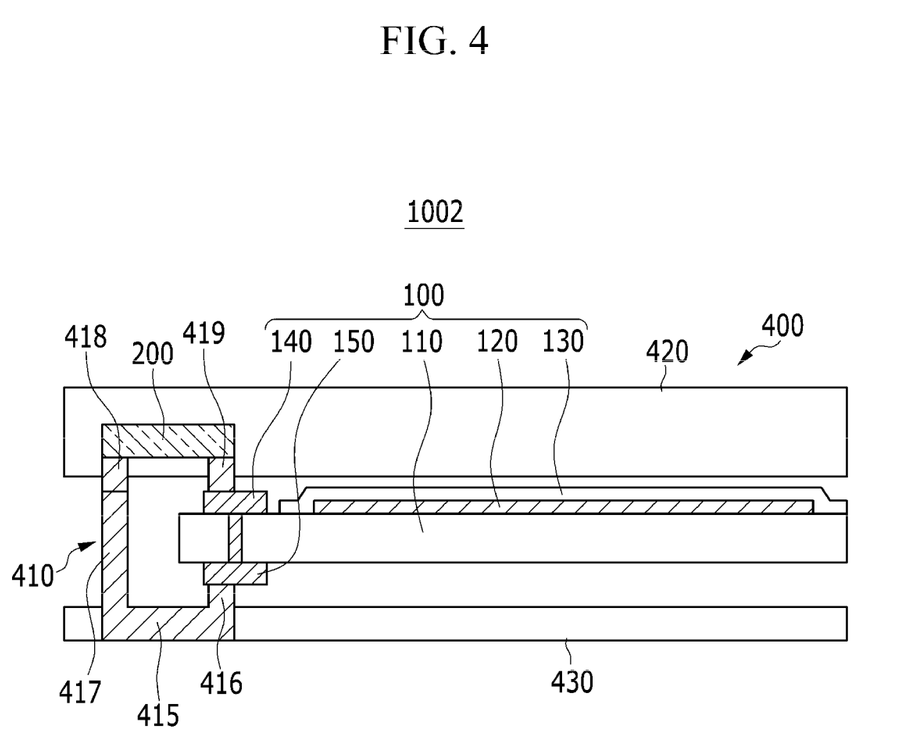
FIG. 4 is a cross-sectional view of a display device according to a second exemplary embodiment.

FIG. 4 is a cross-sectional view of a display device according to a second exemplary embodiment.

As shown in FIG. 4, a display device 1002 according to the second exemplary embodiment includes a display panel 100, a driver 200, and a cover 400.

The display panel 100 displays an image, and includes a substrate 110, a display portion 120 including an organic light emitting element, an encapsulation portion 130, a first pad 140, and a third pad 150.

The first pad 140 is in a non-display of the substrate 110, neighbors the display portion 120, and is connected with the display portion 120. The first pad 140 receives an out signal from the display portion 120. The first pad 140 is in a front side of the display panel 100.

The third pad 150 faces the first pad 140, interposing the display portion 120 and the substrate 110, and is in the non-display area of the substrate 110. The third pad 150 is connected with the first pad 140 through the inside of the substrate 110. The third pad 150 receives the out signal through the first pad 140. The third pad 150 is in a bottom side of the display panel 100.

According to the present embodiment, the driver 200 is in the cover 400, and is connected with the first pad 140 and the third pad 150 through a connection unit 410. The driver 200 may receive an out signal from the first and/or third pads 140 and 150 through the connection unit 410. When the out signal of the display portion 120 is not supplied to the driver 200, the driver 200 does not supply a driving signal to the display portion 120 and/or may delete data stored in the driver 200.

The cover 400 covers the display panel 100, and includes a first sub-cover 420, a second sub-cover 430, and a connection unit 410.

The first sub-cover 420 faces the front side of the display panel 100, and the driver 200 may be located thereinside.

The second sub-cover 430 faces the bottom side of the display panel 100. The second sub-cover 430 faces the first sub-cover 420, with the display panel 100 interposed therebetween.

The second sub-cover 430 and the first sub-cover 420 protect the display panel from external interference.

The connection unit 410 connects the first and third pads 140 and 150 with the driver 200 by contacting the first pad 140 and the third pad 150 to transmit the out signal applied to the first pad 140 and the third pad 150 from the display portion 120 to the driver 200. The connection unit 410 is formed of a conductive material, such as a metal, and includes a second internal line 415, a third bump 416 (or third connection portion), a fourth bump 417 (or a fourth connection portion), a fifth bump 418 (or fifth connection portion), and a sixth bump 419 (or sixth connection portion).

The second internal line 415 is in (or at, or on) the second sub-cover 430, and extends in the second sub-cover 430 so as to correspond to each of the third pad 150 and the fifth bump 418.

The third bump 416 extends in a direction of the third pad 150 from one end of the second internal line 415. The third bump 416 protrudes to the outside of the second sub-cover 430 from the inside of the second sub-cover 430. The third bump 416 protrudes to the outside of the second sub-cover 430, and thus, contacts the third pad 150.

The fourth bump 417 extends in a direction of the fifth bump 418 from the other end of the second internal line 415. The fourth bump 417 protrudes to the outside of the second sub-cover 430 from the inside of the second sub-cover 430. The fourth bump 417 protrudes to the outside of the second sub-cover 430, and thus, contacts the fifth bump 418.

The fifth bump 418 is connected with the driver 200, and thus, extends in a direction of the fourth bump 417 from the driver 200. The fifth bump 418 protrudes to the outside of the first sub-cover 420 from the inside of the first sub-cover 420. The fifth bump 418 protrudes to the outside of the first sub-cover 420, and thus, contacts the fourth bump 417.

The second internal line 415, the third bump 416, and the fourth bump 417 may be integrally formed. The third bump 416 and the fourth bump 417 respectively contact the third pad 150 and the fifth bump 418 such that the out signal applied to the third pad 150 from the display portion 120 through the first pad 140 is applied to the driver 200 from the third pad 150 through third bump 416, the second internal line 415, the fourth bump 417, and the fifth bump 418.

The sixth bump 419 extends in a direction of the first pad 140 from the driver 200. The sixth bump 419 protrudes to the outside of the first sub-cover 420 from the inside of the first sub-cover 420. The sixth bump 419 protrudes to the outside of the first sub-cover 420, and thus, contacts the first pad 140 to connect the driver 200 and the first pad 140. Because the sixth bump 419 is connected with the driver 200, and thus, contacts the first pad 140, the out signal applied to the first pad 140 from the display portion 120 is applied to the driver 200 from the first pad 140 through the sixth bump 419.

Hereinafter, an effect of the display device according to the second exemplary embodiment will be described with reference to FIG. 5.

Hereinafter, characteristic components distinguished from the first exemplary embodiment will be described in detail, and other components may be described by referring to the above-described embodiments. In addition, in the second exemplary embodiment, for convenience of description, like elements will be described by using like reference numerals of the first exemplary embodiment.

Figure 5:
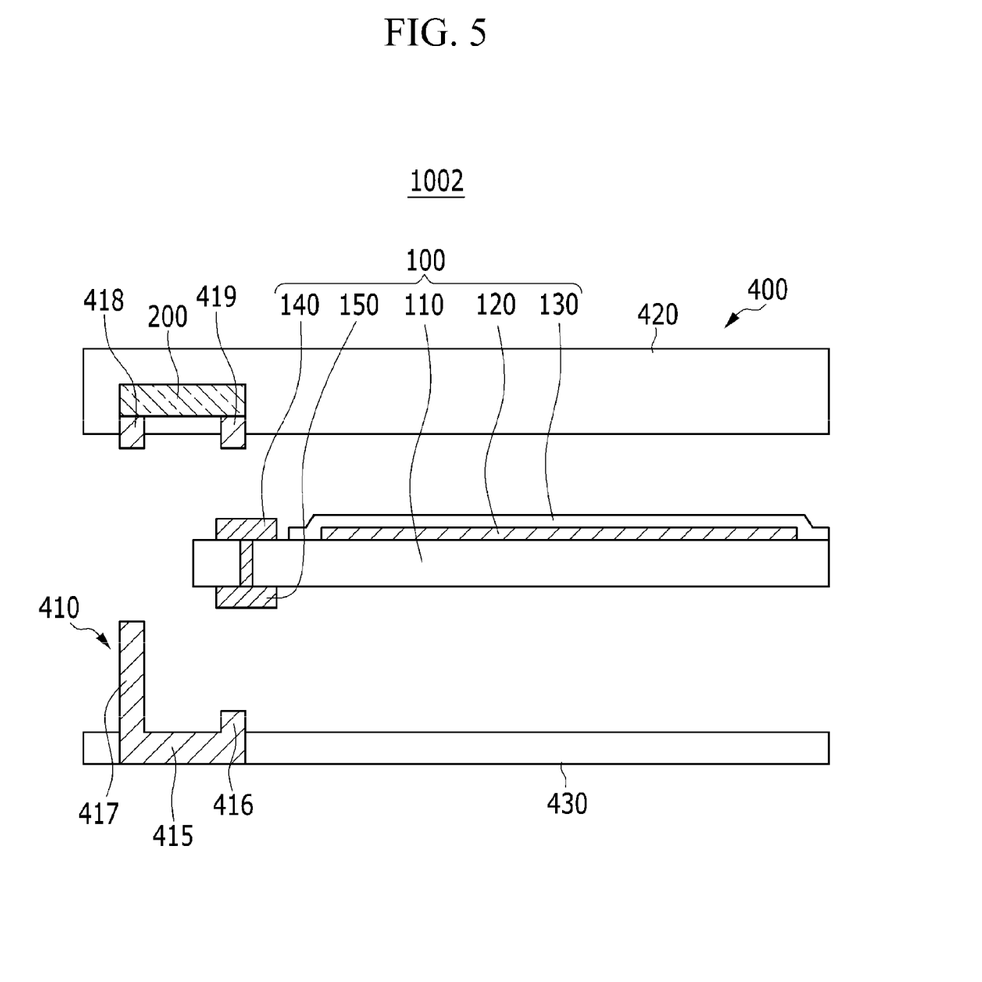
FIG. 5 is a cross-sectional view provided for description of an effect of the display device according to the second exemplary embodiment.

FIG. 5 is a cross-sectional view provided for description of an effect of the display device according to the second exemplary embodiment.

As shown in FIG. 5, when the first sub-cover 420 is separated from the display panel 100, the sixth bump 419 of the connection unit 410 separates from the first pad 140, and thus, the out signal applied to the first pad 140 from the display portion 120 is not applied to the driver 200. Accordingly, the out signal cannot be transmitted to the driver 200 from the display portion 120. That is, when the cover 400 is separated from the display panel 100, the out signal is not transmitted to the driver 200 from the display portion 120.

In addition, when the second sub-cover 430 is separated from the display panel 100, the third bump 416 of the connection unit 410 separates from the third pad 150, and thus, the out signal applied to the third pad 150 from the display portion 120 through the first pad 140 cannot be applied to the driver 200 through the third bump 416, the second internal line 415, the fourth bump 417, and the fifth bump 418. Accordingly, the out signal is not transmitted to the driver 200 from the display portion 120. That is, when the cover 400 is separated from the display panel 100, the out signal is not transmitted to the driver 200 from the display portion 120 through the connection unit 410.

As described, when the out signal is not transmitted to the driver 200 from the display portion 120, the driver 200 does not supply a driving signal for driving the display panel 100 to the display portion 120. Thus, when the first sub-cover 420 or the second sub-cover 430 is separated from the display panel 100, the driver 200 does not supply the driving signal to the display panel 100 (i.e., the display panel 100 is not driven). Accordingly, when the first sub-cover 420 or the second sub-cover 430 is separated from the display panel 100 for analysis of the display panel 100, various techniques of a manufacturer of the display panel 100 (e.g., techniques for driving the display panel 100) cannot be analyzed.

According to one embodiment, when the out signal is not transmitted to the driver 200 from the display portion 120, the driver 200 deletes data stored in the driver 200. Thus, when the first sub-cover 420 or the second sub-cover 430 is separated from the display panel 100, no data is present in the driver 200, and thus, data stored in the driver 200 cannot be analyzed.

That is, technical exposure of the manufacturer of the display panel 100 of the display device 1002 may be suppressed.

According to one embodiment of the display device, the out signal is not transmitted to the driver 200 from the display portion 120 through the connection unit 410 when the first sub-cover 420 of the second sub-cover 430 is separated from the display panel 100, and thus, if the driver stores data indicating that the out signal was not transmitted to the driver 200, it may be determined, through the driver 200, whether or not the cover 400 was separated from the display panel 100.

That is, whether or not the display device 1002 has been disassembled may be determined.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A display device comprising:
    a display panel comprising:
        a display portion for displaying an image; and
        a first pad coupled with the display portion and for receiving an out signal from the display portion;
    a driver coupled with the display portion for supplying a driving signal to the display portion;
    a cover covering the display panel; and
    a connection unit coupling the first pad and the driver to each other to transmit the out signal to the driver,
    wherein the first pad is at a front side of the display panel,
    wherein the display panel further comprises a second pad coupled to the first pad and at a bottom side of the display panel,
    wherein the cover comprises:
    a first sub-cover facing a front side of the display panel, the driver being in the first sub-cover; and
    a second sub-cover facing a bottom side of the display panel and separated from the first sub-cover, the display panel being interposed between the first sub-cover and the second sub-cover, and
    wherein the connection unit comprises:
    a first internal line in the second sub-cover;
    a first connection portion coupled to the first internal line, protruding to an outside of the second sub-cover, and contacting the second pad;
    a second connection portion coupled to the first internal line and protruding to the outside of the second sub-cover;

a third connection portion coupled to the driver, protruding to an outside of the first sub-cover, and contacting the second connection portion; and a fourth connection portion coupled to the driver, protruding to the outside of the first sub-cover, and contacting the first pad.

2. The display device of claim 1, wherein the driver is configured to not transmit the driving signal to the display portion when the out signal is not received by the driver through the connection unit.

3. The display device of claim 1, wherein the driver is configured to delete data stored in the driver when the out signal is not received by the driver through the connection unit.

4. The display device of claim 1, wherein the display portion comprises an organic light emitting element.

5. The display device of claim 1, wherein the connection unit is configured to disconnect from the first pad when the cover is separated from the display portion.

* * * * *